(12) United States Patent
Hashimoto

(10) Patent No.: US 7,423,698 B2
(45) Date of Patent: Sep. 9, 2008

(54) AMPLIFIER FOR AMPLIFYING INPUT SIGNAL SUCH AS VIDEO SIGNAL AND OUTPUTTING AMPLIFIED SIGNAL

(75) Inventor: Fuminori Hashimoto, Fukaya (JP)

(73) Assignee: Sanyo Electric Co., Ltd., Osaka (JP)

( * ) Notice: Subject to any disclaimer, the term of this patent is extended or adjusted under 35 U.S.C. 154(b) by 592 days.

(21) Appl. No.: 10/992,029

(22) Filed: Nov. 18, 2004

(65) Prior Publication Data

US 2005/0105364 A1 May 19, 2005

(30) Foreign Application Priority Data

Nov. 19, 2003 (JP) ............................. 2003-389835

(51) Int. Cl.
*H04N 5/14* (2006.01)
*H04N 5/18* (2006.01)

(52) U.S. Cl. ...................... 348/707; 348/730; 348/689; 327/536

(58) Field of Classification Search ................ 348/707, 348/730, 689; 330/96, 82, 207 R; 327/536, 327/541; 363/59, 60; 455/253.2
See application file for complete search history.

(56) References Cited

U.S. PATENT DOCUMENTS

| | | | |
|---|---|---|---|
| 3,708,615 A | * | 1/1973 | Wharton .................... 348/675 |
| 4,091,420 A | * | 5/1978 | Omori et al. ............... 348/707 |
| 4,897,774 A | * | 1/1990 | Bingham et al. ............ 363/61 |
| 5,282,170 A | * | 1/1994 | Van Buskirk et al. .. 365/185.33 |
| 5,317,202 A | * | 5/1994 | Waizman .................... 327/156 |
| 5,392,205 A | * | 2/1995 | Zavaleta ..................... 363/59 |
| 5,416,691 A | * | 5/1995 | Croughwell ................. 363/60 |
| 5,532,960 A | * | 7/1996 | Lin et al. ................ 365/185.29 |
| 5,539,356 A | * | 7/1996 | Arntz ......................... 329/370 |
| 5,546,048 A | * | 8/1996 | Sano et al. .................. 330/263 |
| 5,661,436 A | * | 8/1997 | Kresock ..................... 330/265 |
| 5,694,084 A | * | 12/1997 | Sakurai ...................... 330/288 |
| 5,699,018 A | * | 12/1997 | Yamamoto et al. .......... 330/297 |
| 5,903,320 A | * | 5/1999 | Heber-Suffrin et al. ..... 348/707 |
| 5,920,225 A | * | 7/1999 | Choi et al. .................. 327/536 |
| 5,999,045 A | * | 12/1999 | Claverie et al. .............. 330/11 |
| 6,021,056 A | * | 2/2000 | Forbes et al. ................. 363/60 |

(Continued)

FOREIGN PATENT DOCUMENTS

JP 7-298607 11/1995

(Continued)

OTHER PUBLICATIONS

English Patent Abstract of 7-298607 from esp@cenet.

(Continued)

*Primary Examiner*—David Ometz
*Assistant Examiner*—Jean W Désir
(74) *Attorney, Agent, or Firm*—Osha Liang LLP

(57) ABSTRACT

An amplifier which amplifies an input signal, wherein an amplified signal which varies with a ground voltage as a center is obtained at an output of the amplifier using a positive power supply and a negative power supply. With this configuration, an amplified signal which varies with the ground voltage as a center can be obtained at the output of the amplifier so that a direct current cutting capacitor is no longer necessary.

3 Claims, 11 Drawing Sheets

U.S. PATENT DOCUMENTS

| | | | |
|---|---|---|---|
| 6,023,188 A * | 2/2000 | Lee et al. | 327/536 |
| 6,191,642 B1 | 2/2001 | Nguyen | |
| 6,373,325 B1 | 4/2002 | Kuriyama et al. | |
| 6,952,240 B2 * | 10/2005 | Gower et al. | 348/678 |
| 6,970,035 B2 | 11/2005 | Tanimoto et al. | |
| 7,023,262 B2 * | 4/2006 | Sim et al. | 327/541 |
| 7,129,939 B2 * | 10/2006 | Toyozawa et al. | 345/211 |
| 7,142,254 B2 * | 11/2006 | Fielding | 348/707 |
| 7,184,099 B1 * | 2/2007 | Hojabri | 348/696 |
| 7,208,995 B2 * | 4/2007 | Hashimoto | 327/536 |
| 2002/0118052 A1 * | 8/2002 | Kao | 327/157 |
| 2002/0121928 A1 | 9/2002 | Fielding | |
| 2004/0080359 A1 * | 4/2004 | Chen et al. | 327/536 |
| 2005/0077950 A1 * | 4/2005 | Robinson, Jr. | 327/536 |
| 2005/0083090 A1 * | 4/2005 | Moraveji | 327/157 |
| 2006/0044052 A1 * | 3/2006 | Hashimoto | 327/536 |

FOREIGN PATENT DOCUMENTS

| | | |
|---|---|---|
| TW | 451490 B | 8/2001 |
| TW | 466495 B | 12/2001 |
| TW | 529230 B | 4/2003 |
| TW | 541449 B | 7/2003 |
| WO | 01/71893 | 9/2001 |
| WO | 01/73928 | 10/2001 |

OTHER PUBLICATIONS

Taiwan Office Action issued in TW Application No. 093120425 dated Nov. 21, 2007, English translation attached (7 pages).

Taiwan Office Action issued in TW Application No. 093120425 dated Mar. 24, 2006, English translation attached (5 pages).

* cited by examiner

AMPLIFIER FOR AMPLIFYING INPUT SIGNAL SUCH AS VIDEO SIGNAL AND OUTPUTTING AMPLIFIED SIGNAL

CROSS-REFERENCE TO RELATED APPLICATIONS

The entire disclosure of Japanese Patent Application No. 2003-389835 including specification, claims, drawings and abstract is incorporated herein by reference.

BACKGROUND OF THE INVENTION

1. Field of the Invention

The present invention relates to an amplifier for amplifying an input signal such as a video signal and outputting the amplified signal.

2. Description of the Related Art

Conventionally, a circuit as shown in FIG. 8 has been used as a processor circuit for a video signal. In this circuit, a pedestal level or a synch-tip level of a video signal is clamped by a clamp circuit 10 and the video signal is amplified by a pre-amplifier 12 and a main amplifier 14. An output of the main amplifier 14 is output to a co-axial power supply line 16 via a DC-cut capacitor Cdc.

As described, this circuit requires a capacitor Cdc for cutting the DC component. In the case of a video signal, because an input/output impedance is 75 Ω and a lower frequency component of the signal is approximately 60 Hz, in order to output the signal of the lower frequency component while preventing generation of a level shift and sag, the capacitance of the capacitor Cdc must be set to a very large value such as, for example, 470 μF-1000 μF. A capacitor having such a high capacitance is expensive and, moreover, requires a large space for provision of the capacitor and related wiring.

It is very important to reduce the cost and size in portable devices such as a digital video camera, and therefore, the capacitance of the capacitor is set to a minimum possible value. However, when the capacitance is reduced, the direct current component of the output changes, which may cause problems such as, for example, detection of a synchronizing signal for an output signal being difficult.

In consideration of this, another circuit is known in which an output of a capacitor Cdc is fed back to a main amplifier 14 via another capacitor Ca, as shown in FIG. 9. In this circuit, the capacitance of the capacitor Cdc can be set to approximately 22 μF-470 μF and the capacitance of the capacitor Ca can be set to approximately 10 μF to 22 μF. The output from the main amplifier 14 in this circuit is as shown in FIG. 10(b) for an input signal of a rectangular waveform as shown in FIG. 10(a) and an output through the capacitor Cdc is as shown in FIG. 10(c), which allows correction to a shape with the sag removed. By using such a sag correction circuit, it is possible to reduce the capacitance of the capacitor Cdc.

Even with the circuit shown in FIG. 9, however, a large capacitance is necessary for preventing a direct current shift. In addition, because of the recent trend of reduction in the voltage used as the power supply voltage, it is now more difficult to correct sag. That is, when a dynamic range in the output of the main amplifier 14 is not sufficient, the sharp extruding portion of the edges in FIG. 10 (b) is cut, and as a result, sufficient sag correction cannot be applied. Because of this, there is a problem in the video signal in that the synchronizing signal is suppressed and the synchronizing signal cannot be detected.

SUMMARY OF THE INVENTION

According to one aspect of the present invention, there is provided an amplifier which amplifies an input signal, wherein an amplified signal which varies with a ground voltage as a center voltage is obtained at an output of the amplifier using a positive power supply and a negative power supply.

BRIEF DESCRIPTION OF THE DRAWINGS

A preferred embodiment of the present invention will be described in detail based on the following figures, wherein.

DESCRIPTION OF PREFERRED EMBODIMENT

Figure 1:
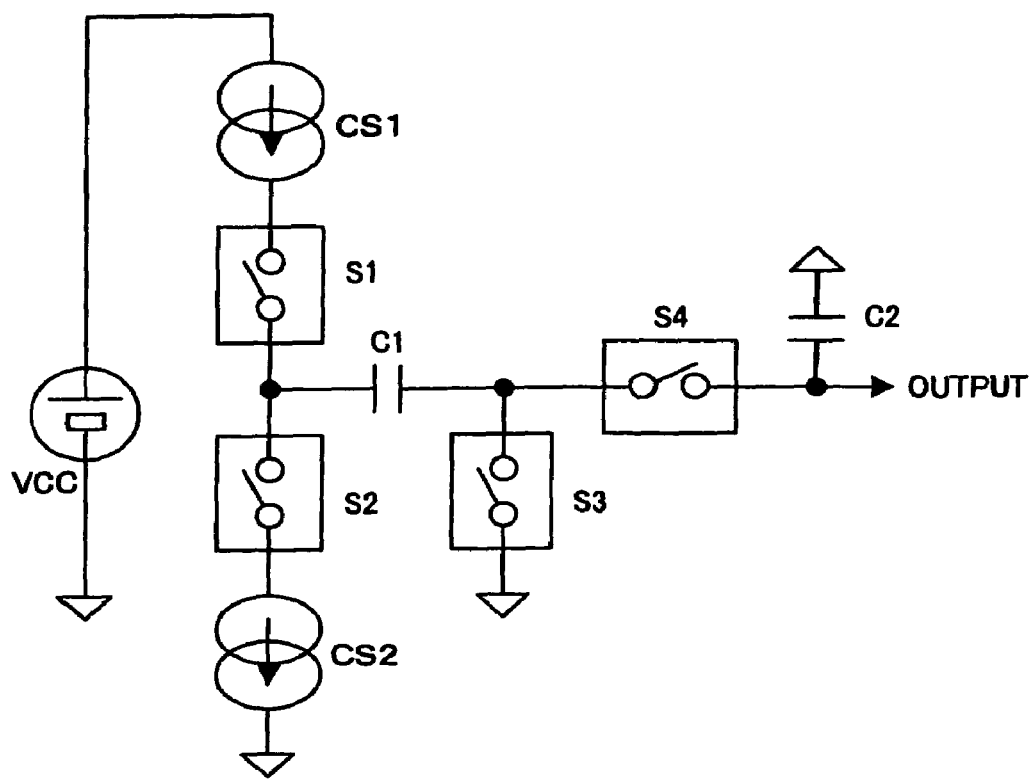
FIG. 1 is a diagram showing a structure of a charge pump according to a preferred embodiment of the present invention.

A preferred embodiment (hereinafter referred to simply as "embodiment") of the present invention will now be described referring to the drawings.

Video Signal Processor Circuit

Figure 4:
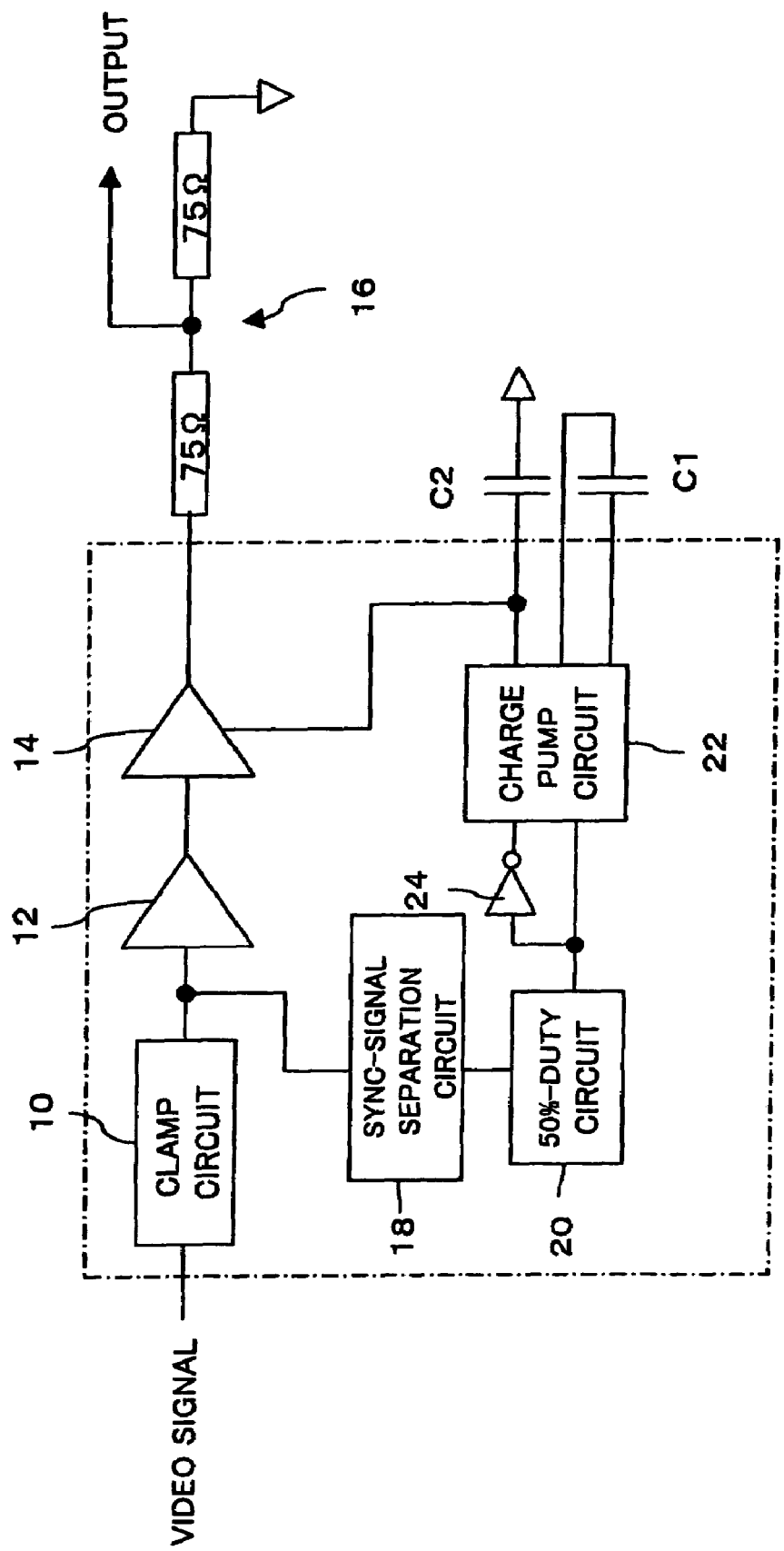
FIG. 4 is a diagram showing a structure of an amplifier according to a preferred embodiment of the present invention.
Figure 5:
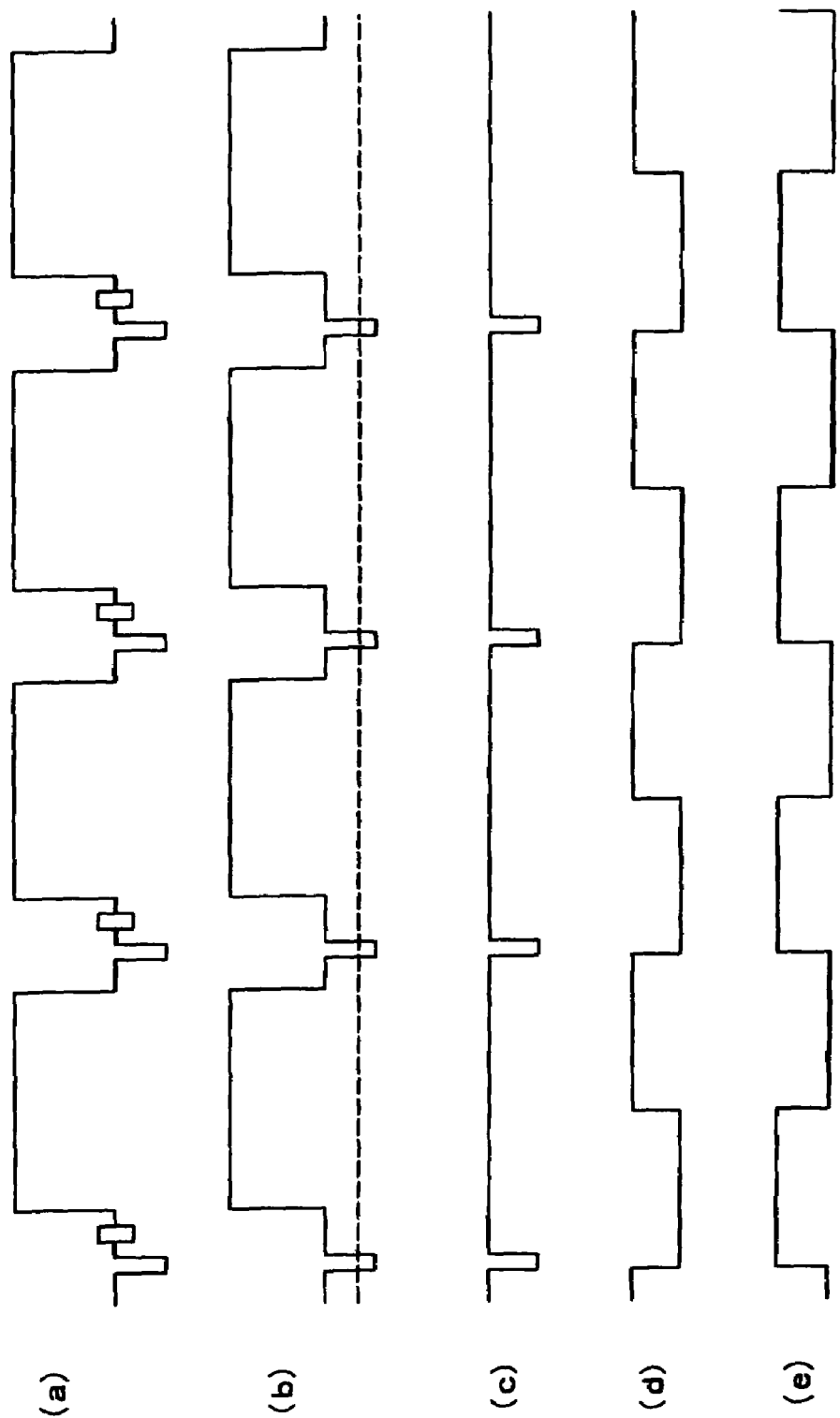
FIG. 5 is a diagram showing waveforms at various sections.

FIG. 4 shows a video signal processor circuit. A video signal is input to a clamp circuit 10. The clamp circuit 10 clamps a pedestal level or sync-tip level which indicates a constant direct current (DC) level in the video signal. The video signal has a waveform such as shown in FIG. 5(a) and a horizontal synchronizing signal of a low level is placed at the beginning of one horizontal period. The clamp circuit 10 sets the level of the horizontal synchronizing signal to a predetermined voltage. An output of the clamp circuit 10 is amplified with a predetermined amplification in a pre-amplifier 12 and is then amplified to a predetermined level in a main amplifier 14. The video signal thus obtained is output via a coaxial power supply line 16 of 75 Ω. Here, transmission of signals through the coaxial power supply line 16 corresponds to outputting the input signal from an intermediate point between two resistances of 75 Ω as shown in FIG. 4. In FIG.

4, a section surrounded by a dotted chain line is formed in one semiconductor integrated circuit.

The output of the clamp circuit 10 is also input to a sync-signal separation circuit 18. The sync-signal separation circuit 18 separates the horizontal synchronizing signal by extracting portions of the signal having a predetermined level or lower as shown in FIG. 5(b). In this manner, a horizontal synchronizing signal formed of a pulse signal for each horizontal line as shown in FIG. 5(c) is obtained. It is possible to form a vertical synchronizing signal into pulses similar to the horizontal synchronizing signal by detecting a rise or a fall in the horizontal synchronizing signal and generating a pulse of a constant period based on the detected rise or fall. In the period of switching between an odd field and an even field, a horizontal synchronizing signal is output at a period which is half the horizontal period. This signal can be removed by, for example, providing a half-edge killer for masking approximately 75% of a horizontal period.

An output of the sync-signal separation circuit 18 is supplied to a 50%-duty circuit 20. The 50%-duty circuit 20 generates and outputs a signal as shown in FIG. 5(d), which has a period of one horizontal period and a duty factor of approximately 50% in which the H and L levels are switched at a middle point. This signal is directly supplied to a charge pump circuit 22 which functions as a negative power supply and also via an inverter 24 to the charge pump circuit 22 such that an inverted signal as shown in FIG. 5(e) is supplied.

Therefore, two clocks are supplied to the charge pump circuit 22, one of which is a signal shown in FIG. 5(d) having an L level at a first half of a horizontal period and an H level at a second half of the horizontal period and the other of which is a signal shown in FIG. 5(e) having an H level at the first half of the horizontal period and an L level at the second half of the horizontal period. Alternatively, the signal to be supplied to the charge pump circuit 22 may be only one of the signals shown in FIGS. 5(d) and 5(e).

The charge pump circuit 22 receives an input of a power supply voltage VCC and generates a voltage of −VCC using the clocks described above. Capacitors C1 and C2 are external components of the charge pump circuit 22 and are therefore shown separately from the charge pump circuit 22 in FIG. 4.

An output of the charge pump circuit 22 is supplied to the main amplifier 14 as its negative power supply. Thus, the main amplifier 14 can operate between the normal power supply voltage VCC and the negative power supply voltage −VCC and can output a positive signal and a negative signal with reference to 0 V as a video signal to be output. Therefore, there is an advantage that the capacitor for cutting the direct current component at the output is not necessary.

In particular, in the embodiment, the horizontal synchronizing signal contained in the video signal is used as the clock of the charge pump circuit 22. Therefore, no separate oscillator or the like is required at the charge pump circuit 22.

Figure 6:
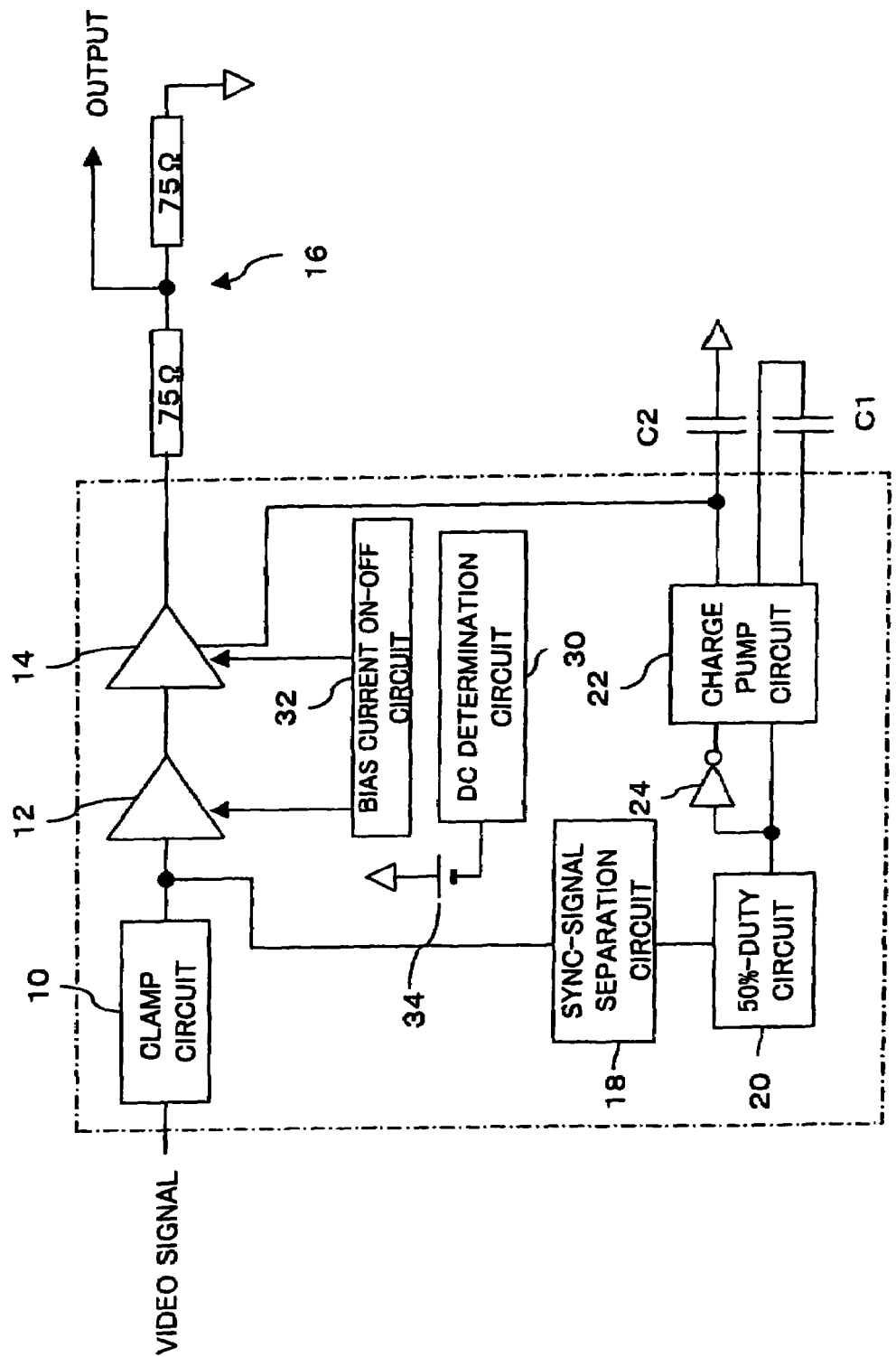
FIG. 6 is a diagram showing another structure of an amplifier according to a preferred embodiment of the present invention.

FIG. 6 is a diagram showing a structure of another preferred embodiment of the present invention. In this embodiment, a DC determination circuit 30 and a bias current on-off circuit 32 are added to the structure of FIG. 4. A power supply 34 having a predetermined negative reference voltage which is higher (closer to 0 V) than the output of the charge pump circuit 22 is connected to the DC determination circuit 30. The DC determination circuit 30 compares the negative voltage −VCC from the charge pump circuit 22 with the reference negative voltage from the negative reference power supply 34 and determines whether or not the charge pump circuit 22 is sufficiently functioning. The DC determination circuit 30 may be of any structure as long as the DC determination circuit 30 can determine whether or not the output from the charge pump circuit 22 is sufficient, and a configuration may be employed, for example, in which a voltage divider resistor of a high resistance is placed between a power supply voltage and the negative power supply −VCC and it is determined whether or not the divided voltage is a predetermined value or less.

When the DC determination circuit 30 determines that the output of the charge pump circuit 22 is insufficient, the bias current on-off circuit 32 stops operations of the pre-amplifier 12 and the main amplifier 14. For example, because each of the pre-amplifier 12 and the main amplifier 14 uses a constant current circuit for their operations, the bias current on-off circuit 32 may stop operations of these constant current circuits to stop the operations of the pre-amplifier 12 and the main amplifier 14. It is also possible to stop the operations of the pre-amplifier 12 and the main amplifier 14 in a different manner such as, for example, stopping supply of the power supply voltage to the pre-amplifier 12 and the main amplifier 14.

In this manner, in the embodiment, the operations of the pre-amplifier 12 and the main amplifier 14 are stopped when the output of the charge pump circuit 22 is insufficient, which allows for reduction in power consumption. In particular, in the embodiment, a horizontal synchronizing signal separated from the video signal which is the input signal is used as the operation clock of the charge pump circuit 22. Therefore, during a wait time or the like when there is no input of the video signal which is the target signal to be processed, the operation of the charge pump circuit 22 is stopped and, consequently, operations of the pre-amplifier 12 and the main amplifier 14 are stopped, allowing for reduction in the power consumption.

Figure 7:
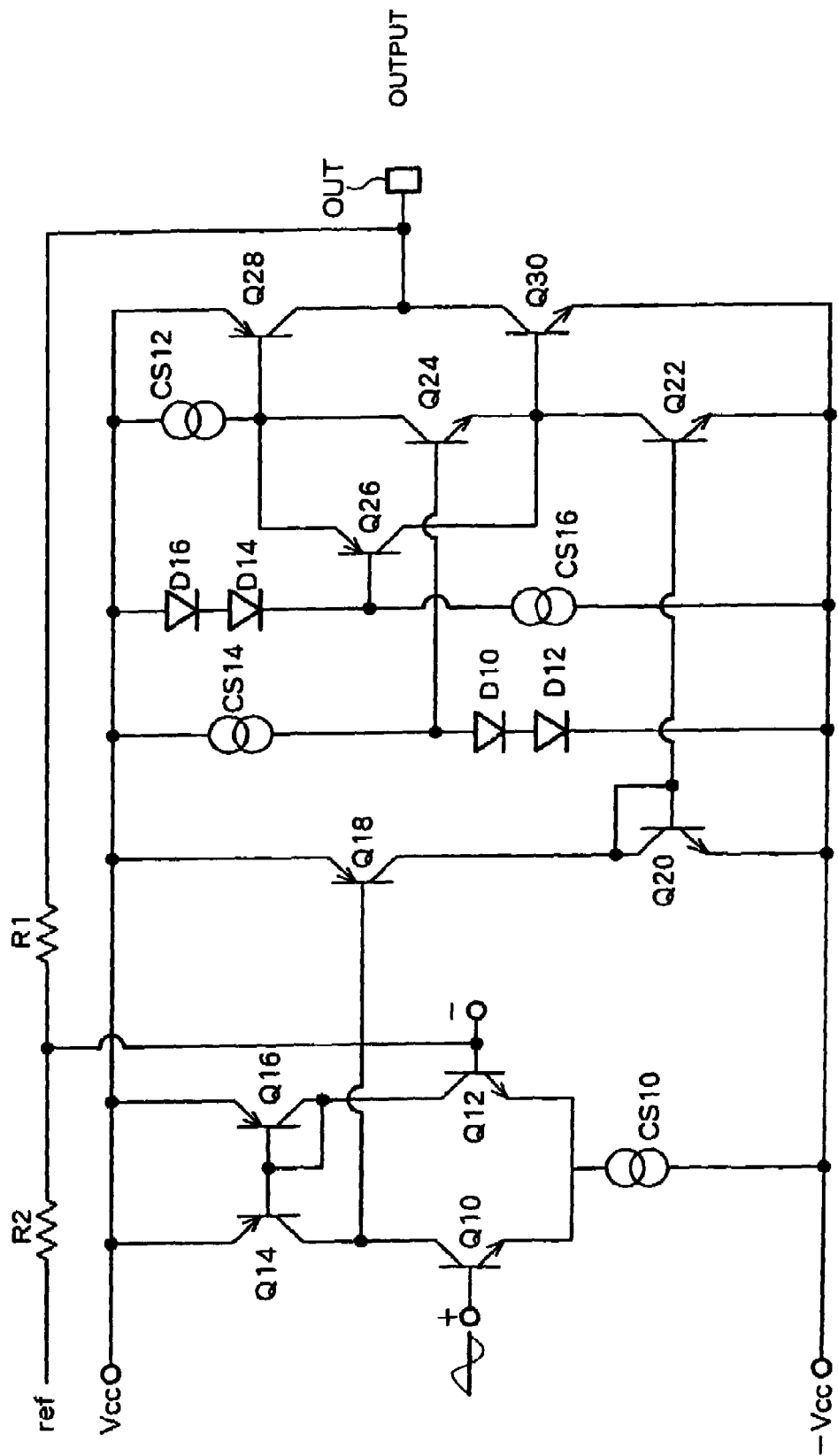
FIG. 7 is a diagram showing a structure of a main amplifier.
Figure 8:
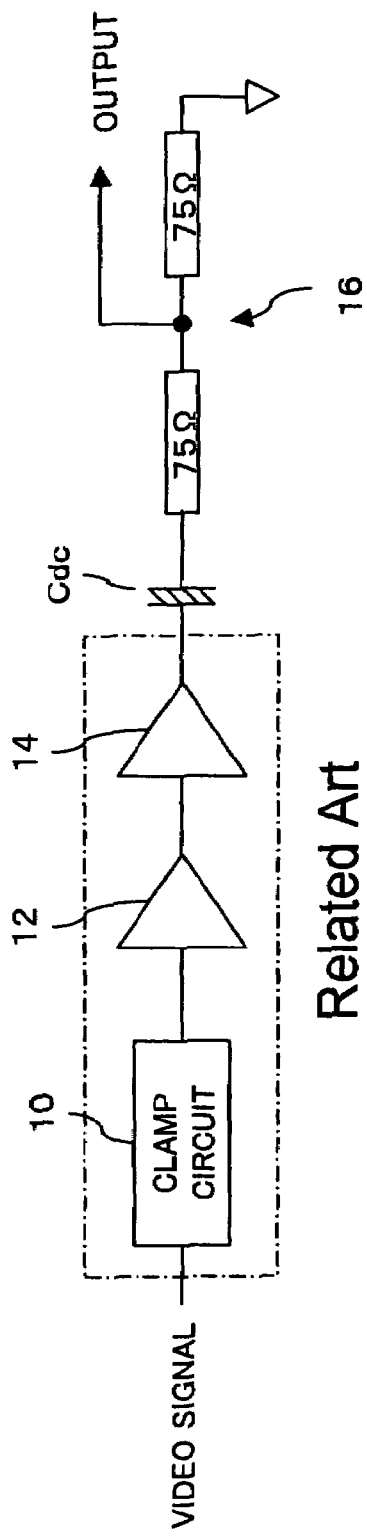
FIG. 8 is a diagram showing a structure of an amplifier according to a related art.
Figure 9:
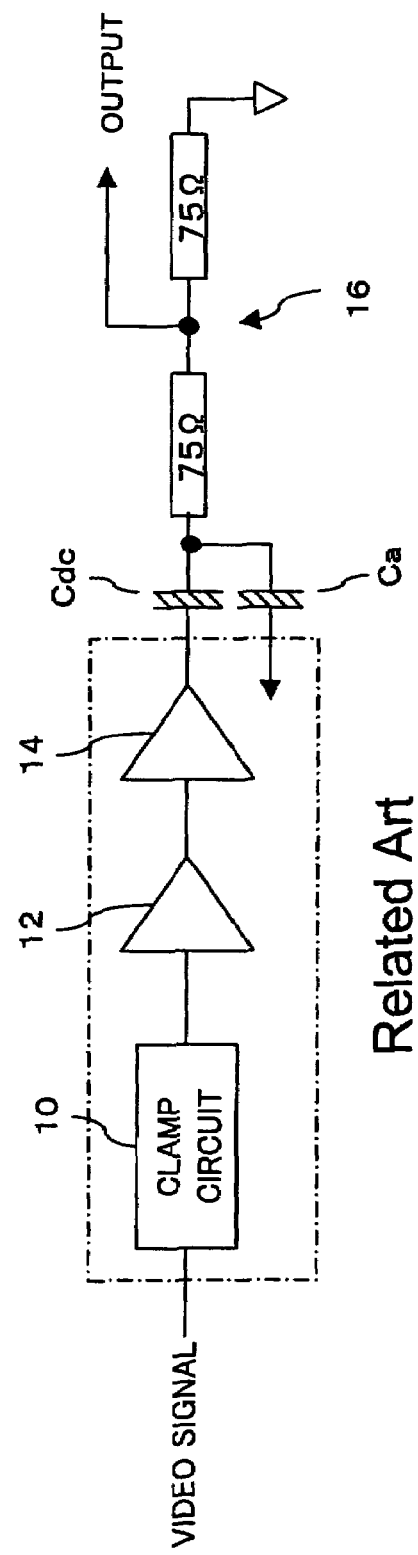
FIG. 9 is a diagram showing another structure of an amplifier according to a related art.
Figure 10:
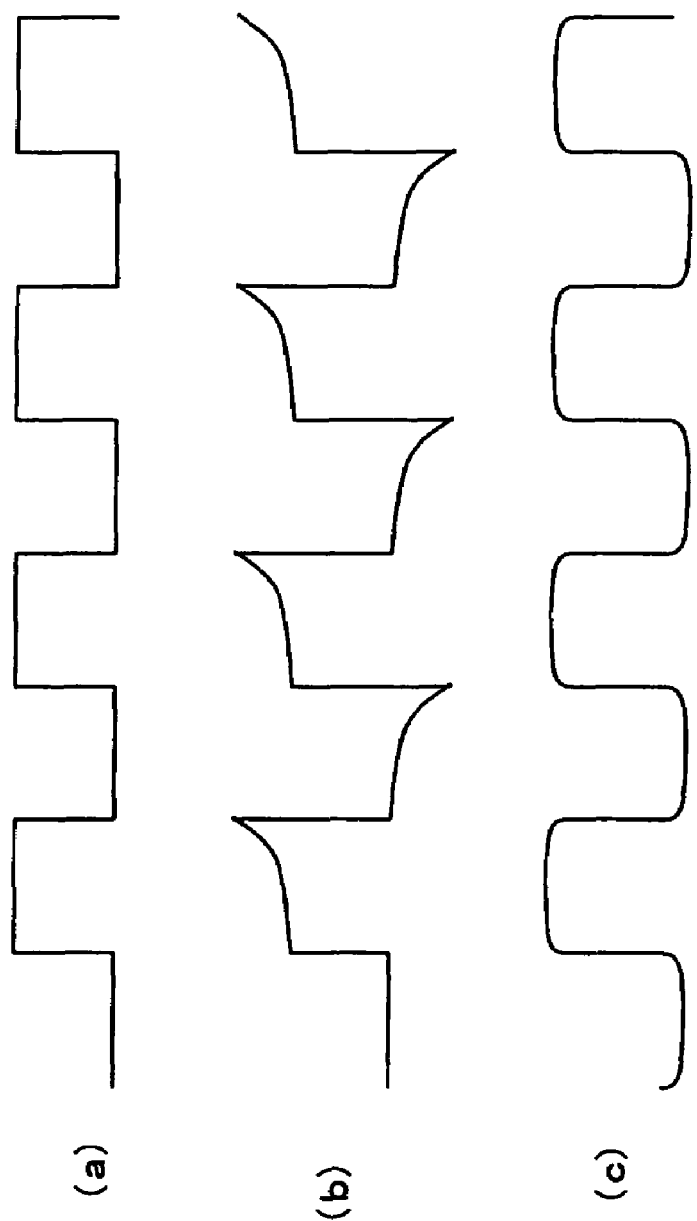
FIG. 10 is a diagram showing waveforms at various sections in a related art.

FIG. 7 exemplifies a schematic structure of an example main amplifier 14. A pair of npn type transistors Q10 and Q12 to which complementary input signals are input have their emitters connected to each other and to a negative power supply −VCC via a constant current circuit CS10. Collectors of the transistors Q10 and Q12 are respectively connected to collectors of a pair of pnp type transistors Q14 and Q16. Emitters of the transistors Q14 and Q16 are connected to a power supply VCC. Bases of the transistors Q14 and Q16 are connected to each other. The transistor Q16 has its base and collector connected (short circuited). The transistors Q14 and Q16 thus form a current mirror structure. A connection point between the collector of the transistor Q14 and the collector of the transistor Q10 forms an output terminal and a signal in which the input signal is differentially amplified is obtained at the output terminal.

The connection point (output terminal) between the collector of the transistor Q14 and the collector of the transistor Q10 is connected to a base of a pnp type transistor Q18 having its emitter connected to the power supply VCC. A collector of the transistor Q18 is connected to a collector of an npn type transistor Q20. The transistor Q20 has its base and collector connected and its emitter connected to the negative power supply −VCC.

The base of the transistor Q20 is connected to a base of an npn type transistor Q22 having its emitter connected to the negative power supply −VCC. Thus, the transistors Q20 and Q22 form a current mirror structure.

A collector of the transistor Q22 is connected to an emitter of a transistor Q24 and a collector of the transistor Q24 is connected to the power supply VCC via a constant current circuit CS12. The collector of the transistor Q22 is also connected to a collector of a pnp type transistor Q26 and an emitter of the transistor Q26 is connected to the constant current circuit CS12 along with the collector of the transistor Q24. In other words, the transistors Q24 and Q26 are connected in parallel to each other between the constant current circuit CS12 and the transistor Q22.

A base of the transistor Q24 is connected to a connection point between a downstream side of a constant current circuit CS14 and an anode of a diode D10. An upstream side of the constant current circuit CS14 is connected to the power supply VCC and a cathode of the diode. D10 is connected to an anode of another diode D12. A cathode of the diode D12 is connected to the negative power supply −VCC. That is, a constant current from the constant current circuit CS14 flows through the diodes D10 and D12 and the base voltage of the transistor Q24 is maintained at a voltage which is higher than the negative power supply voltage −VCC by an amount corresponding to voltage drops in the two diodes D10 and D12.

A base of the transistor Q26 is connected to a connection point between an upstream side of a constant current circuit CS16 and a cathode of a diode D14. A downstream side of the constant current circuit CS16 is connected to the negative power supply voltage −VCC and an anode of the diode D14 is connected to a cathode of another diode D16. An anode of the diode D16 is connected to the power supply voltage VCC. That is, a constant current from the constant current circuit CS16 flows through the diodes D14 and D16 and the base voltage of the transistor Q26 is maintained at a voltage which is lower than the power supply voltage VCC by an amount corresponding to voltage drops in the two diodes D14 and D16.

The downstream side of the constant current circuit CS12 to which the collector of the transistor Q24 and the emitter of the transistor Q26 are connected is connected to a base of a pnp type transistor Q28. An emitter of the transistor Q28 is connected to the power supply VCC and a collector of the transistor Q28 is connected to an output terminal OUT. The collector of the transistor Q22 to which the emitter of the transistor Q24 and the collector of the transistor Q26 are connected is connected to a base of an npn type transistor Q30. An emitter of the transistor Q30 is connected to the negative power supply −VCC and a collector of the transistor Q30 is connected to the output terminal OUT.

The output terminal OUT is also connected to a base of the transistor Q12 via a resistor R1 (negative feedback). In addition, a reference voltage ref is supplied to the base of the transistor Q12 via a resistor R2.

In such a configuration, a signal obtained by amplifying an input signal input to the bases of the transistors Q10 and Q12 is supplied to the base of the transistor Q18 and a current corresponding to the signal flows through the transistor Q22 via the transistors Q18 and Q20. The collector of the transistor Q22 is connected to one constant current circuit CS12 via the transistors Q24 and Q26. Therefore, when a current flowing through the transistor Q22 becomes larger than a predetermine amount, the base current of the transistor Q28 is increased and a current corresponding to this base current is output from the output terminal OUT. When, on the other hand, the current flowing through the transistor Q22 becomes lower than a predetermined amount, the base current of the transistor Q30 is increased and a current corresponding to this base current is output from the output terminal OUT.

The output from the output terminal would fall between the power supply voltage VCC and the negative power supply voltage −VCC. For example, it is possible to set the output to a signal which oscillates around 0 V. By changing the reference voltage ref, it is possible to set an offset voltage for the input signal and to set a DC component at the output. Therefore, it is possible to obtain an output, at the output terminal OUT, similar to the output obtained when a DC component is cut with a capacitor. In other words, it is possible to obtain an output having no DC component at the main amplifier 14 using the negative power supply −VCC, and therefore, it is possible to omit the DC cutting capacitor.

When the operation of the main amplifier 14 having such a configuration is to be stopped, it is possible to stop the operation of the main amplifier 14 by stopping the operations of the constant current circuits CS10, CS12, CS14, and CS16. Normally, the constant current circuits CS12 and CS14 at the side of the high voltage power supply are formed by one constant current transistor and a current mirror. Similarly, the constant current circuits CS10 and CS16 at the side of the low voltage power supply are formed by another constant current transistor and a current mirror. Therefore, it is possible to stop the amplifier by prohibiting the current through these two constant current transistors. A similar configuration applies to the pre-amplifier 12.

Charge Pump Circuit

FIG. 1 is a diagram showing a structure of a charge pump circuit according to a preferred embodiment of the present invention. This circuit is also a charge pump circuit for obtaining a negative voltage −VCC from the power supply voltage VCC.

One terminal of the power supply VCC is connected to ground having a voltage of 0 V and another terminal of the power supply VCC is connected to one terminal of a capacitor C1 via a constant current circuit CS1 and a switch S1.

This terminal of the capacitor C1 is also connected to ground via a switch S2 and a constant current circuit CS2.

The other terminal of the capacitor C1 is connected to ground via a switch S3 and to an output terminal via a switch S4. In addition, one terminal of a capacitor C2 having the other terminal connected to ground is connected to the output terminal.

In a charge pump circuit having such a structure, a pair of switches S1 and S3 (a first switch circuit) and a pair of switches S2 and S4 (a second switch circuit) are switched on and off in a complementary manner. That is, when the switches S1 and S3 are switched on, the switches S2 and S4 are switched off, when the switches S2 and S4 are switched on, the switches S1 and S3 are switched off, and these configurations are periodically repeated.

During the period when the switches S1 and S3 are switched on, a current from the constant current circuit CS1 is supplied to an input side of the capacitor C1 and the output side of the capacitor C1 is set at a ground potential. With this configuration, the capacitor C1 is charged to the voltage VCC. During the period when the switches S2 and S4 are switched on, on the other hand, a current of the constant current circuit C2 is drawn from the input side of the capacitor C1 and the voltage is reduced to the ground potential. In this case, although the output side of the capacitor is connected to the output terminal, it is separated from ground. Thus, the charged state of the capacitor C1 is maintained and the voltage at the output side of the capacitor C1 is set to −VCC, resulting in the negative voltage −VCC appearing as a voltage at the output terminal.

This voltage is also maintained by the capacitor C2 so that the voltage −VCC at the output terminal is maintained.

As described, in the present embodiment, charging and discharging of the capacitor C1 are performed using currents from constant current sources. Therefore, it is possible to limit the amount of charging or discharging current, and to consequently inhibit generation of noise at the power supply and the ground.

Figure 3:
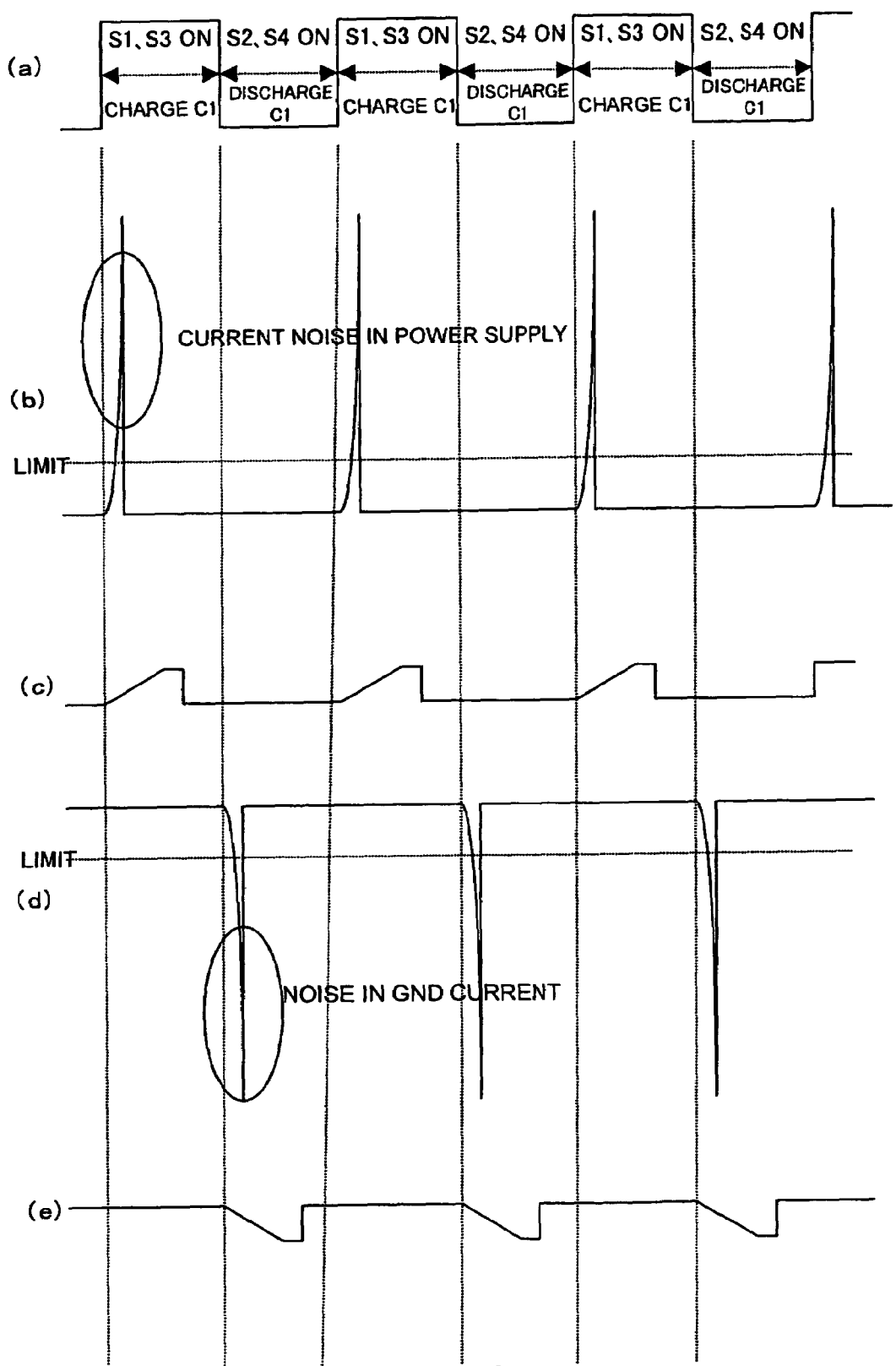
FIG. 3 is a diagram showing waveforms in a preferred embodiment of the present invention and in a comparative example.

FIG. 3(a) shows waveforms of switching in the switches S1-S4. As shown in FIG. 3(a), the pair of switches S1 and S3 and the pair of switches S2 and S4 are switched on in a complementary manner.

Figure 2:
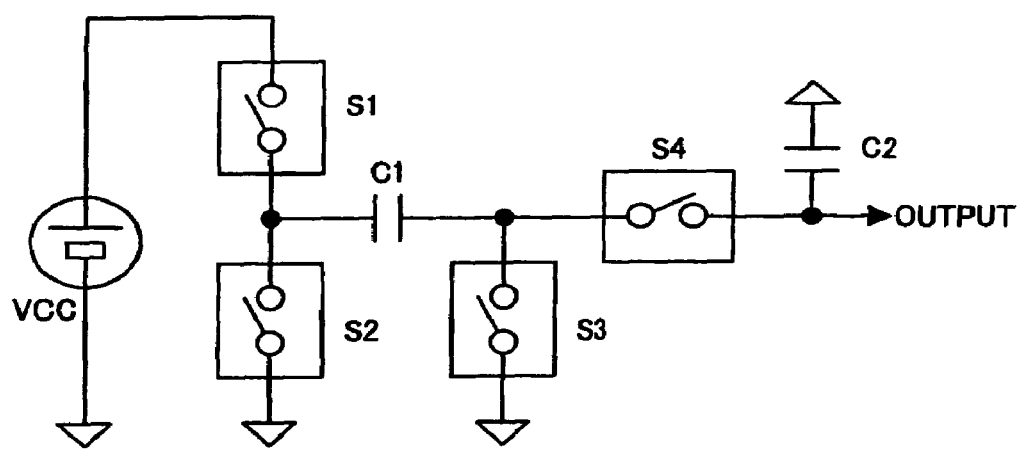
FIG. 2 is a diagram showing a structure of a charge pump according to a comparative example.

FIG. 2 shows a structure of a comparative example in which the constant current circuits CS1 and CS2 are omitted from the structure of FIG. 1, the switch S1 is directly connected to the power supply VCC, and the switch S2 is directly connected to ground.

FIG. 3(b) shows a waveform of current from the power supply in the comparative example of FIG. 2 and FIG. 3(c) shows a waveform of current from the power supply in the embodiment of FIG. 1. It can be seen from these drawings that, by inserting the constant current circuits CS1 and CS2, it is possible to maintain the upper limit of the current value to a suitable value which is lower than the limit value shown in FIG. 3(b) and thus, it is possible to prevent generation of noise in power supply.

FIG. 3(d) shows a waveform of current to ground in the comparative example of FIG. 2 and FIG. 3(e) shows a waveform of current to ground in the embodiment of FIG. 1. It can be seen from these drawings that, by inserting the constant current circuits CS1 and CS2, it is possible to maintain the upper limit of the current value to a suitable value which is lower than the limit value shown in FIG. 3(d) and thus, it is possible to prevent generation of noise in power supply.

Conventionally, a charge pump circuit is used in various circuits. In various portable devices, because a battery power supply is used, the power supply voltage is limited. On the other hand, in various circuits, there is a demand to use the highest possible power supply voltage to facilitate their operations. For this purpose, a charge pump circuit is often provided to boost a voltage of the battery power supply. However, in the conventional charge pump circuit described above, the voltage at the end of the capacitor changes by a large amount during switching. Therefore, a large current flows to the power supply and to ground at the time of switching and noise appears at the power supply, ground, and output terminal. Because of this, although it may be possible to use the conventional charge pump circuit without a problem in a digital circuit, it is difficult to use the conventional charge pump circuit in a semiconductor integrated circuit which handles an analog signal.

For example, when a capacitor (C) of 1 μF is to be charged at 1 V (ΔV) for a time of 1 μsec (Δt), a current of 1 A (ΔI) is necessary. This value can be calculated from an equation, $\Delta I = (C \times \Delta V)/\Delta t$. In a semiconductor integrated circuit, however, a current of 1 A is a large current, and when such current flows every time switching takes place, normally noise is generated.

According to the charge pump circuit of the embodiment, generation of a large current can be prevented with the use of the constant current circuits, to inhibit generation of noise.

Figure 11:
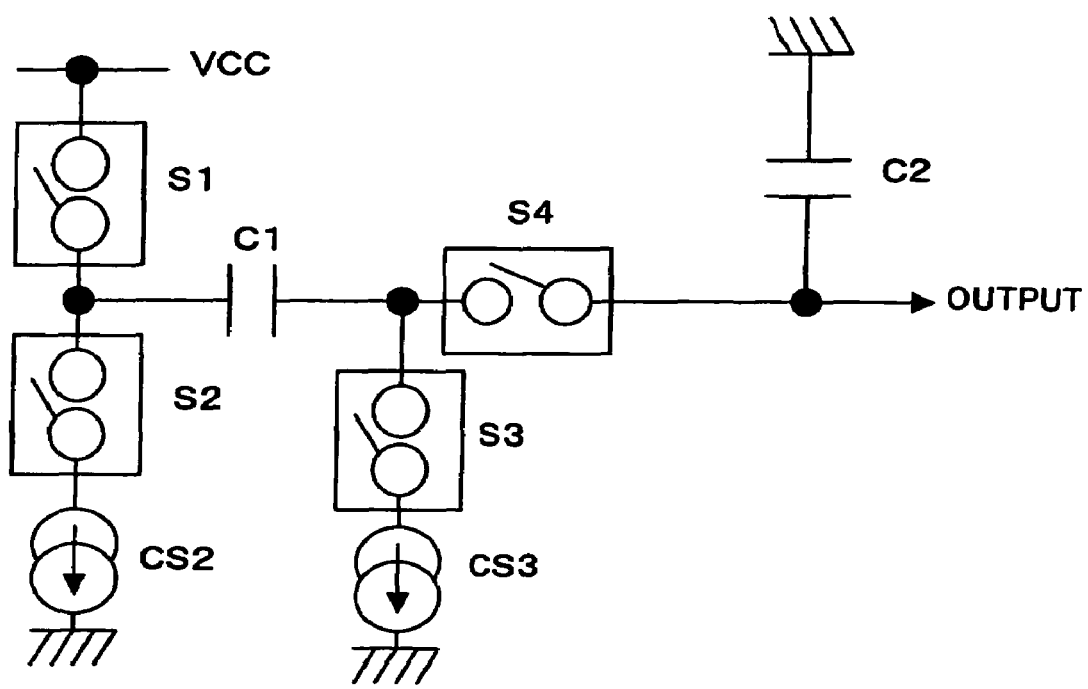
FIG. 11 is a diagram showing another structure of a charge pump according to a preferred embodiment of the present invention.
Figure 12:
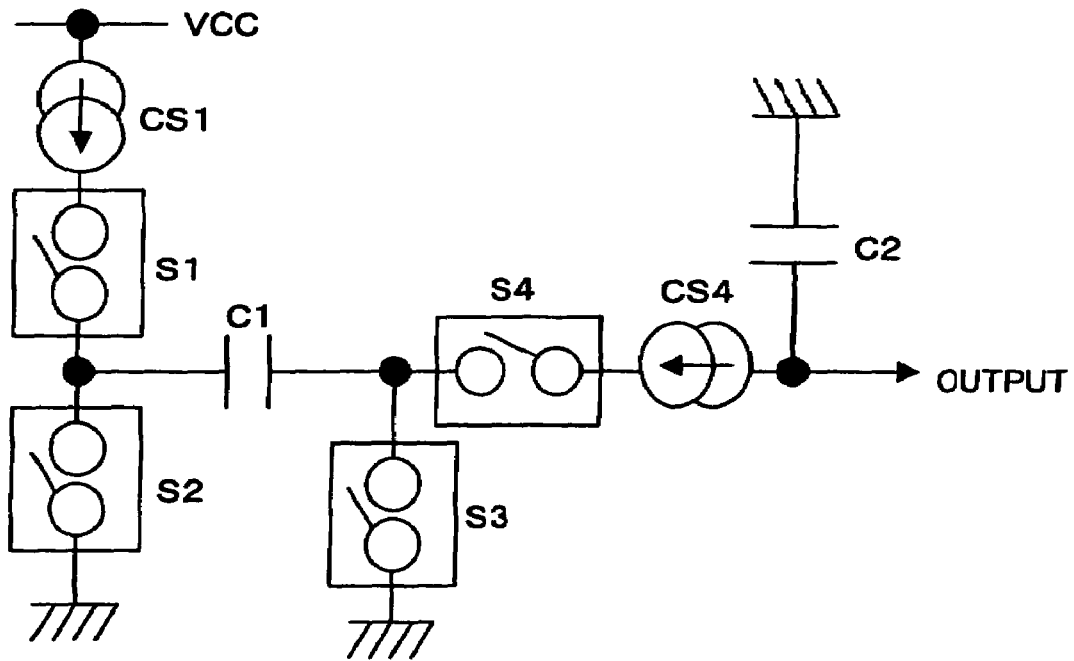
FIG. 12 is a diagram showing another structure of a charge pump according to a preferred embodiment of the present invention.
Figure 13:
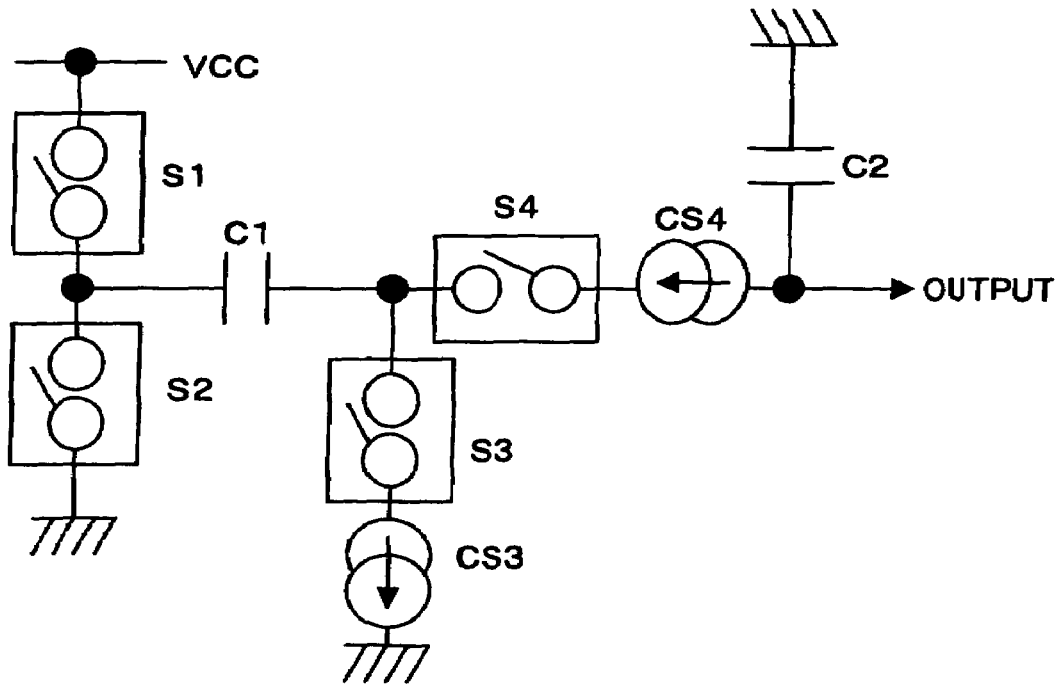
FIG. 13 is a diagram showing another structure of a charge pump according to a preferred embodiment of the present invention.

FIGS. 11-13 show example configurations in which the insertion positions of the constant current circuits are varied. In the configuration of FIG. 11, the constant current circuit CS1 in FIG. 1 is omitted and a constant current circuit CS3 is provided between the switch S3 and ground. In this configuration, when the switches S1 and S3 are switched on, a constant current determined by the constant current circuit CS3 is used as the charging current of the capacitor C1, and thus, advantages similar to those in the configuration of FIG. 1 can be obtained.

In the configuration of FIG. 12, the constant current circuit CS2 in FIG. 1 is omitted and a constant current circuit CS4 is provided between the switch S4 and the output terminal. With this configuration, when the switches S2 and S4 are switched on, a constant current determined by the constant current circuit CS4 is used as the discharging current of the capacitor C1, and thus, advantages similar to those in the configuration of FIG. 1 can be obtained.

In the configuration of FIG. 13, the constant current circuits CS1 and CS2 in FIG. 1 are omitted, a constant current circuit CS3 is provided between the switch S3 and ground, and a constant current circuit CS4 is provided between the switch S4 and the output terminal. With this configuration, when the switches S1 and S3 are switched on, a constant current determined by the constant current circuit CS3 is used as the charging current of the capacitor C1 and, when the switches S2 and S4 are switched on, a constant current determined by the constant current circuit CS4 is used as the discharging current of the capacitor C1.

Figure 14:
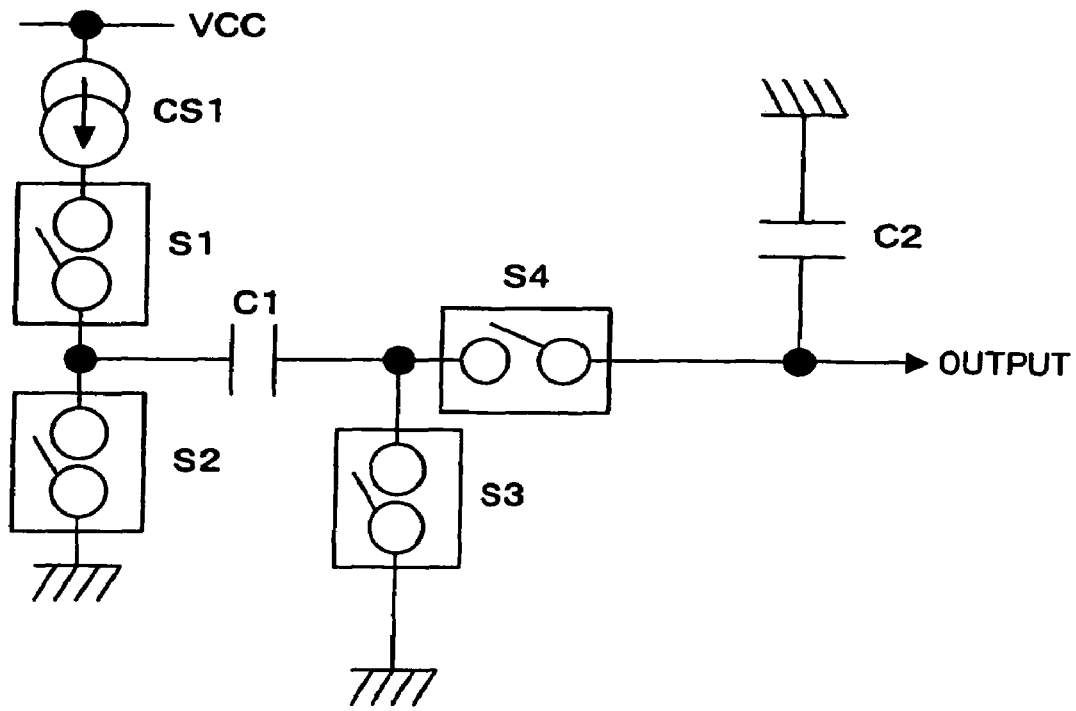
FIG. 14 is a diagram showing another structure of a charge pump according to a preferred embodiment of the present invention.
Figure 15:
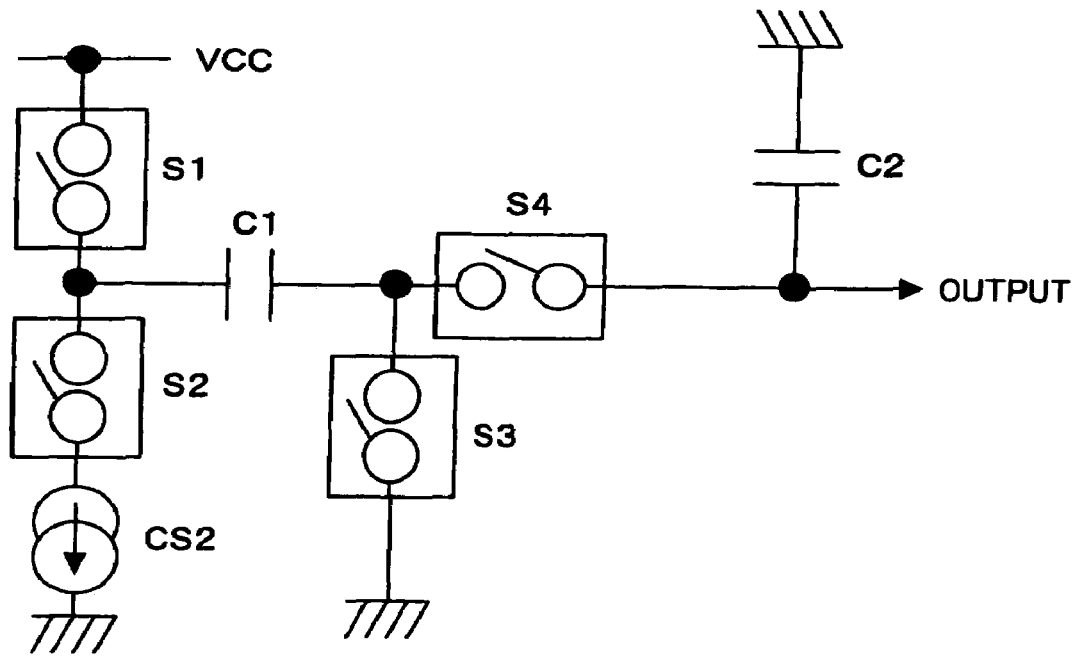
FIG. 15 is a diagram showing another structure of a charge pump according to a preferred embodiment of the present invention.

FIGS. 14 and 15 show example configurations in which one of the constant current circuits CS1 and CS2 is omitted. That is, the constant current circuit CS1 is omitted in the example configuration of FIG. 14 and the constant current circuit CS2 is omitted in the example configuration of FIG. 15. In these alternative configurations, the constant current is used in only one of the charging current and the discharging current, but it is also possible to prevent generation of noise during charging or discharging with these configurations.

What is claimed is:

1. An amplifier for amplifying an input signal,
wherein an amplified signal which varies with a ground voltage as a center voltage is obtained at an output of the amplifier using a positive power supply and a negative power supply,
wherein the negative power supply is generated based on the positive power supply, and
wherein the negative power supply comprises:
a charging constant current circuit which outputs a constant current from the positive power supply;
a discharging constant current circuit which outputs a constant current to a ground power supply;
a first switch which selects one of the charging constant current circuit and the discharging constant current circuit;
a capacitor having a first terminal connected to the first switch and which is charged and discharged; and
a second switch which selectively connects a second terminal of the capacitor to ground or to an output terminal, and the second terminal of the capacitor is connected to ground by the second switch when the charging constant current circuit is selected by the first switch and the second terminal of the capacitor is connected to the output terminal by the second switch when the discharging constant current circuit is selected by the first switch, so that an output of a charge pump circuit for obtaining an output voltage which is lower than the ground by a voltage corresponding to the positive power supply is obtained at the output terminal.

2. An amplifier according to claim 1, wherein the input signal is a video signal containing a synchronizing signal, and the first and second switches are switched based on the synchronizing signal separated from the video signal.

3. An amplifier according to claim 2, further comprising:
a comparison circuit which compares an output of the charge pump circuit with a predetermined voltage; and
a prohibition circuit which prohibits an operation of the amplifier when it is determined from a result of comparison in the comparison circuit that sufficient negative voltage is not obtained.

* * * * *